(12) United States Patent
Huang et al.

(10) Patent No.: US 7,960,241 B2
(45) Date of Patent: Jun. 14, 2011

(54) MANUFACTURING METHOD FOR DOUBLE-SIDE CAPACITOR OF STACK DRAM

(75) Inventors: Shin-Bin Huang, Hsinchu County (TW); Tzung-Han Lee, Taipei (TW); Chung-Lin Huang, Taoyuan County (TW)

(73) Assignee: Inotera Memories, Inc., Taoyuan County (TW)

( * ) Notice: Subject to any disclaimer, the term of this patent is extended or adjusted under 35 U.S.C. 154(b) by 6 days.

(21) Appl. No.: 12/698,322

(22) Filed: Feb. 2, 2010

(65) Prior Publication Data

US 2011/0065253 A1 Mar. 17, 2011

(30) Foreign Application Priority Data

Sep. 11, 2009 (TW) ................. 98130663 A

(51) Int. Cl.
*H01L 21/20* (2006.01)
(52) U.S. Cl. ............... 438/386; 438/397; 257/E21.008
(58) Field of Classification Search .............. 438/386, 438/381, 397, 671, 636, 396, 389, 399, 254.253; 257/E21.008, E21.011, E21.645
See application file for complete search history.

(56) References Cited

U.S. PATENT DOCUMENTS

| 5,399,415 | A | * | 3/1995 | Chen et al. | 428/209 |
|---|---|---|---|---|---|
| 5,683,945 | A | * | 11/1997 | Penner et al. | 438/702 |
| 7,078,307 | B2 | * | 7/2006 | Lin et al. | 438/386 |
| 7,087,497 | B2 | * | 8/2006 | Yuan et al. | 438/295 |
| 7,358,188 | B2 | * | 4/2008 | Basceri | 438/682 |
| 7,449,383 | B2 | * | 11/2008 | Yoon et al. | 438/254 |
| 7,776,706 | B2 | * | 8/2010 | Cheng et al. | 438/386 |
| 7,781,279 | B2 | * | 8/2010 | Tsai et al. | 438/201 |
| 2003/0222296 | A1 | * | 12/2003 | Kumar et al. | 257/301 |
| 2004/0005762 | A1 | * | 1/2004 | Bonart et al. | 438/268 |
| 2004/0036095 | A1 | * | 2/2004 | Brown et al. | 257/296 |
| 2005/0032324 | A1 | * | 2/2005 | Kudelka et al. | 438/389 |
| 2005/0054159 | A1 | * | 3/2005 | Manning et al. | 438/253 |
| 2005/0077563 | A1 | * | 4/2005 | Alsmeier | 257/301 |
| 2006/0014344 | A1 | * | 1/2006 | Manning | 438/243 |
| 2007/0066056 | A1 | * | 3/2007 | Kim et al. | 438/671 |
| 2008/0061340 | A1 | * | 3/2008 | Heineck et al. | 257/301 |
| 2008/0081431 | A1 | * | 4/2008 | Roh et al. | 438/397 |
| 2008/0164582 | A1 | * | 7/2008 | Govindarajan | 257/635 |
| 2008/0305605 | A1 | * | 12/2008 | Cheng et al. | 438/389 |
| 2009/0004808 | A1 | * | 1/2009 | Lee et al. | 438/386 |
| 2009/0184392 | A1 | * | 7/2009 | Cheng et al. | 257/532 |
| 2009/0242954 | A1 | * | 10/2009 | Chou | 257/301 |
| 2009/0278225 | A1 | * | 11/2009 | Pyi | 257/506 |
| 2009/0286377 | A1 | * | 11/2009 | Manning | 438/381 |

* cited by examiner

*Primary Examiner* — Walter L Lindsay, Jr.
(74) *Attorney, Agent, or Firm* — Rosenberg, Klein & Lee

(57) ABSTRACT

A manufacturing method for double-side capacitor of stack DRAM has steps of: forming a sacrificial structure in the isolating trench and the capacitor trenches; forming a first covering layer and a second covering layer on the sacrificial structure; modifying a part of the second covering layer; removing the un-modified second covering layer and the first covering layer to expose the sacrificial structure; removing the exposed part of the sacrificial structure to expose the electrode layer; removing the exposed electrode layer to expose the oxide layer; and removing the oxide layer and sacrificial structure to form the double-side capacitors.

20 Claims, 5 Drawing Sheets

MANUFACTURING METHOD FOR DOUBLE-SIDE CAPACITOR OF STACK DRAM

BACKGROUND OF THE INVENTION

1. Field of the Invention

The present invention relates to a manufacturing method for double-side capacitor of stack DRAM, and in particular to a manufacturing method for double-side capacitor of stack DRAM with simplified steps which is provided for manufactures stack DRAM with high capacity.

2. Description of Related Art

The random access memory (RAM) is a form of computer data storage, which includes transistors, capacitors and peripheral controlling circuit. For increasing the computer performance, it is important to increase the surface of the capacitors so as to improve the electric charge stored on the capacitors.

Double-side capacitors have been studied because of the higher capacity of the electric charges. Moreover, the height of the memory cell can be reduced so that the size of the device can be reduced.

However, the traditional manufacturing method for the double-side capacitor has complicated steps; for example, the precision of alignment of the lithograph is higher than the single-side capacitor. Therefore, the manufacturing yield is too low. On the other hand, the structure of the traditional double-side capacitor is weak so that the electrodes of the capacitor are easily collapsed. Thus, the function of RAM is failed.

In view of the above, the present Inventor proposes a thin key structure capable of reducing the total thickness and weight of the key structure, whereby the key structure becomes more compact and user-friendly to generate a steady operation.

SUMMARY OF THE INVENTION

The objective of the present invention is to provide a manufacturing method with simplified steps, thereby reducing the total manufacturing cost. On the other hand, the double-side capacitor fabricated by the manufacturing method of the present invention has improved structural strength and the property of electric capacity.

The present invention provides a manufacturing method for double-side capacitor of stack DRAM, which includes the steps of: forming an isolating trench and a plurality of capacitor trenches in an oxide layer wherein each of the isolating trench and the capacitor trenches has an electrode layer on a sidewall thereof; forming a sacrificial structure in the isolating trench and the capacitor trenches, respectively; forming a first covering layer and a second covering layer on the sacrificial structure; modifying a part of the second covering layer on the sacrificial structure of the capacitor trenches, and modifying the second covering layer on the sacrificial structure of the isolating trench; removing the un-modified second covering layer on the sacrificial structure of the capacitor trenches, then removing the first covering layer under the un-modified second covering layer on the sacrificial structure of the capacitor trenches to expose the sacrificial structure of the capacitor trenches; removing a part of the sacrificial structure of the capacitor trenches to expose the electrode layer on the sidewall of the capacitor trenches; removing the exposed electrode layer on the sidewall of the capacitor trenches to expose the oxide layer; and removing the sacrificial structure in the isolating trench and the capacitor trenches, and removing the oxide layer between the capacitor trenches so that the electrode layers of the capacitor trenches are constructed as a plurality of double-side capacitors and the sacrificial structure.

In comparison with prior art, the present invention has advantageous features as follows: a single-side etching process is used for exposing the double-side of the electrode layer which are constructed as the double-side capacitors. The manufactured double-side capacitors of the present invention have improved electric capacity. Furthermore. The manufacturing method is used for improving the manufacturing yield and the manufactured device has reduced size.

In order to further understand the characteristics and technical contents of the present invention, a description relating thereto will be made with reference to the accompanying drawings. However, the drawings are illustrative only but not used to limit the present invention.

DETAILED DESCRIPTION OF THE PREFERRED EMBODIMENTS

The aforesaid and other technical contents, features and effects of the present invention will be explained in detail with reference to the description of a preferred embodiment and the accompanying drawings.

Please refer to FIGS. 1 and 2A to 2I, the present invention discloses a manufacturing method for double-side capacitor of stack DRAM. The method provides a single-side etching process to manufacturing the double-side capacitor structure to improve the capacity of the stack DRAM. Furthermore, the manufacturing method of the present invention has simplified steps so as to reduce the manufacturing cost. The manufacturing method of the present invention has the following steps:

Step (a) is forming an isolating trench 11A and a plurality of capacitor trenches 11B in an oxide layer 10. A memory cell includes a peripheral areas and array areas, and a moat structure is formed between the peripheral areas and array areas. The moat structure is constructed by the isolating trench 11A, and the capacitor trench 11B is formed as the capacitor of the array areas. Please refer to FIG. 1; there are three trenches formed in the oxide layer 10, and the left trench is defined as the isolating trench 11A. On the other hand, the other two trenches are defined as the capacitor trenches 11B.

Figure 1:
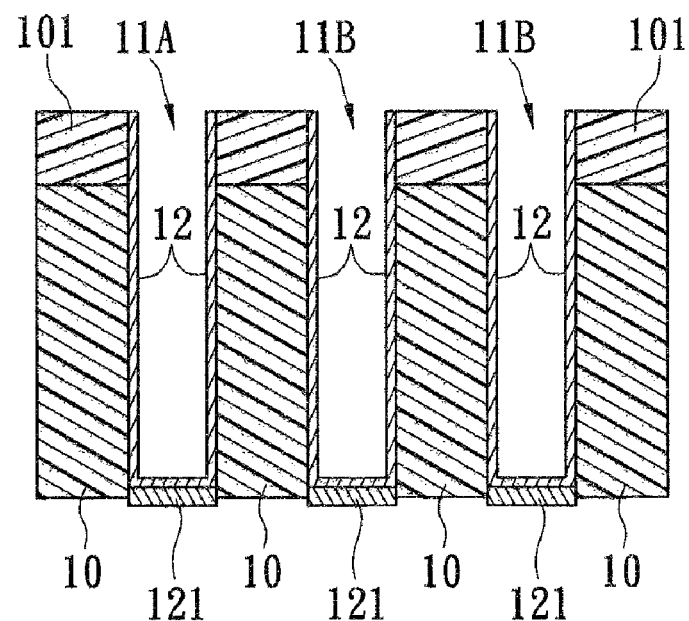
FIG. 1 shows the isolating trench and the capacitor trenches formed in an oxide layer and each of the isolating trench and the capacitor trenches has an electrode layer on a sidewall thereof according to the present invention.

As shown in FIG. 1, each of the isolating trench 11A and the capacitor trenches 11B has an electrode layer 12 on a sidewall thereof. Preferably, the electrode layer 12 is formed on the sidewall and the bottom of the isolating trench 11A and the capacitor trenches 11B. In the embodiment, the oxide layer 10 is made of silicon oxide material and is formed on a substrate. The electrode layer 12 is a metal layer of titanium nitride (TiN) and there is a metal layer 121 of titanium nitride (Ti) material formed under the electrode layer 12 in the bottom of the isolating trench 11A and the capacitor trenches 11B. Moreover, a supporting layer 101 is formed on the oxide layer 10 for supporting the electrode layer 12. The supporting layer 101 can be a silicon nitride (SiN) layer and the isolating trench 11A and the capacitor trench 11B are formed in the supporting layer 101 and the oxide layer 10.

Figure 2A:
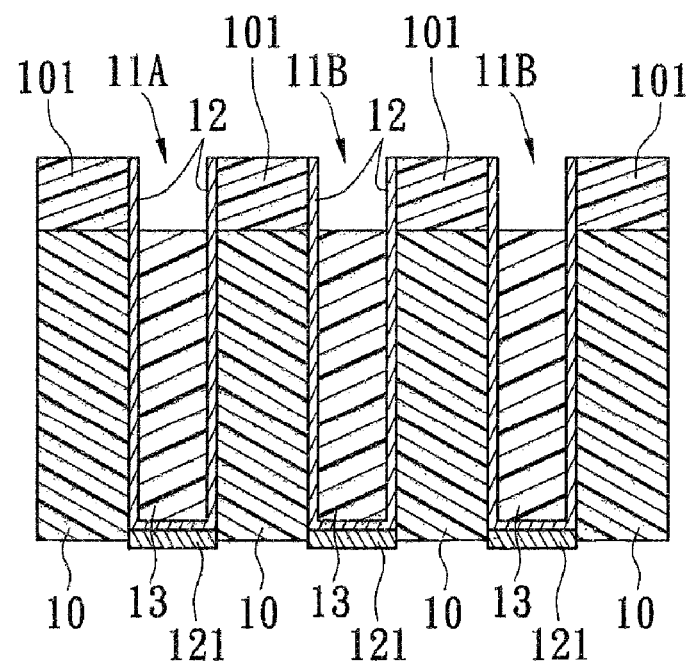
FIGS. 2A-2I shows the steps of the manufacturing method for double-side capacitor of stack DRAM according to the present invention.

Step (b) is forming a sacrificial structure 13 in the isolating trench 11A and the capacitor trenches 11B respectively, as shown in FIG. 2A. In the embodiment, the sacrificial structure 13 of poly-silicon is filled into the isolating trench 11A and the capacitor trench 11B, and then, the filled poly-silicon is etched back to adjusted the height of the sacrificial structure 13. As shown in FIG. 2A, the top of the sacrificial structure is lowered by the etching back step and is close to the bottom of the supporting layer 101. In other words, the sacrificial structure 13 is formed in the isolating trench 11A and the capacitor trench 11B and the height of the sacrificial structure 13 is aligned to the height of the oxide layer 10.

Figure 2B:
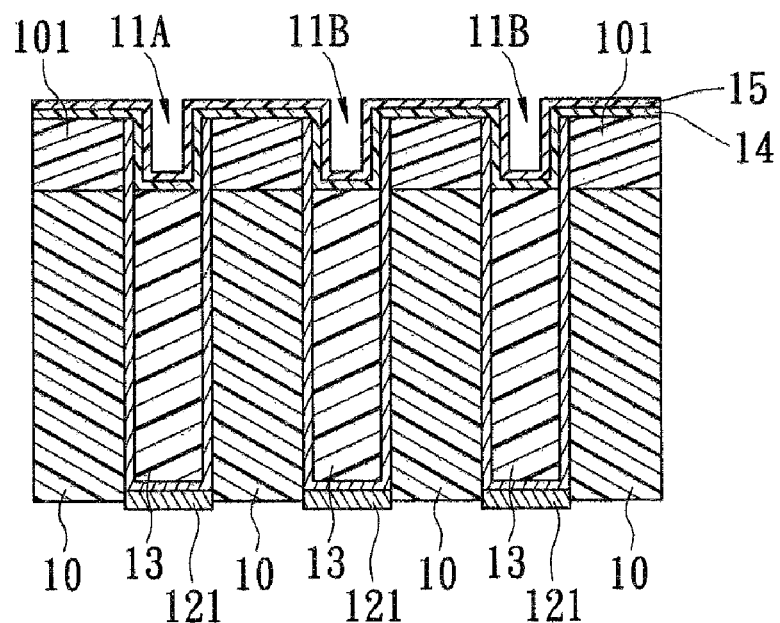
Figure 2C:
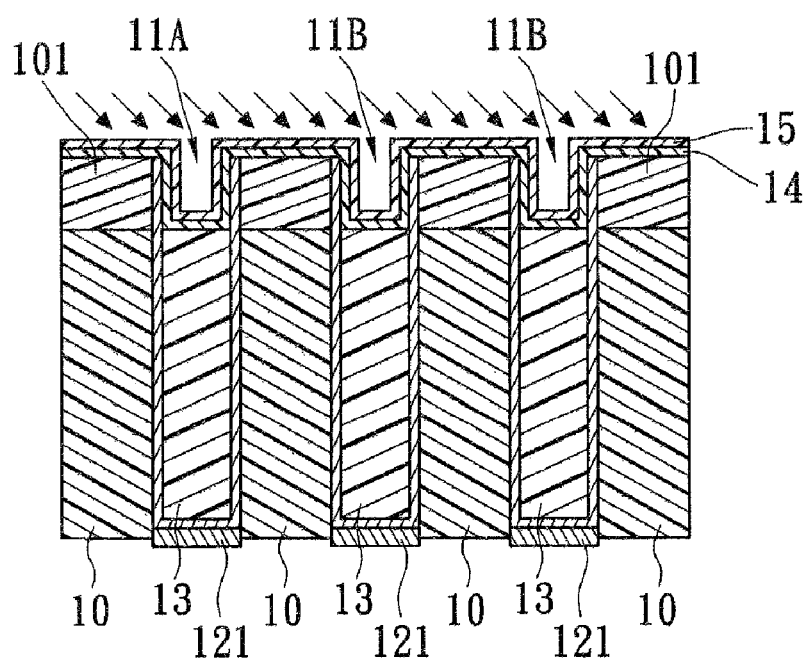
Figure 2D:
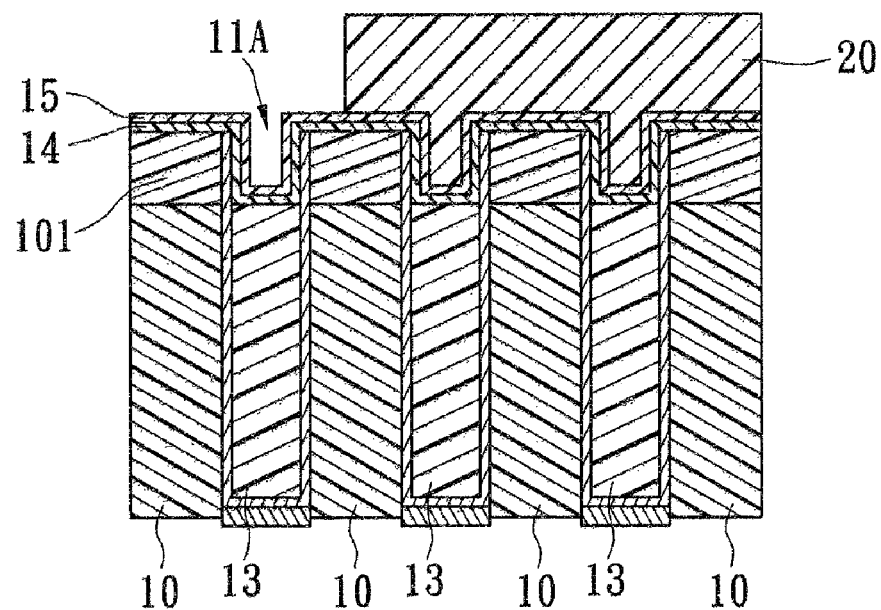
Figure 2E:
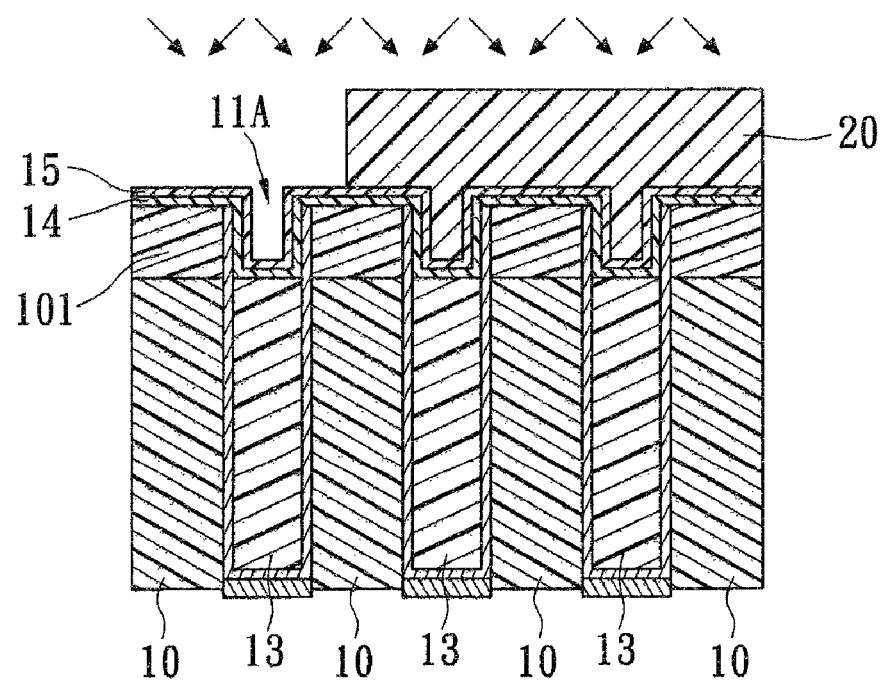
Figure 2F:
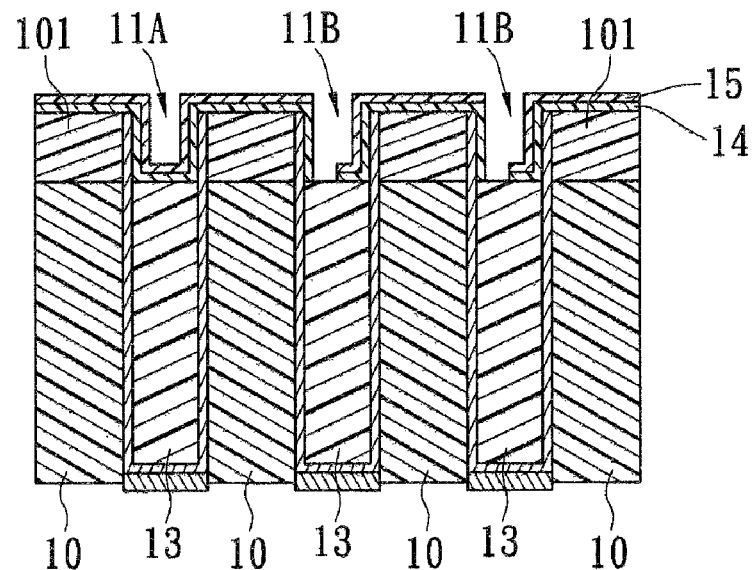
Figure 2G:
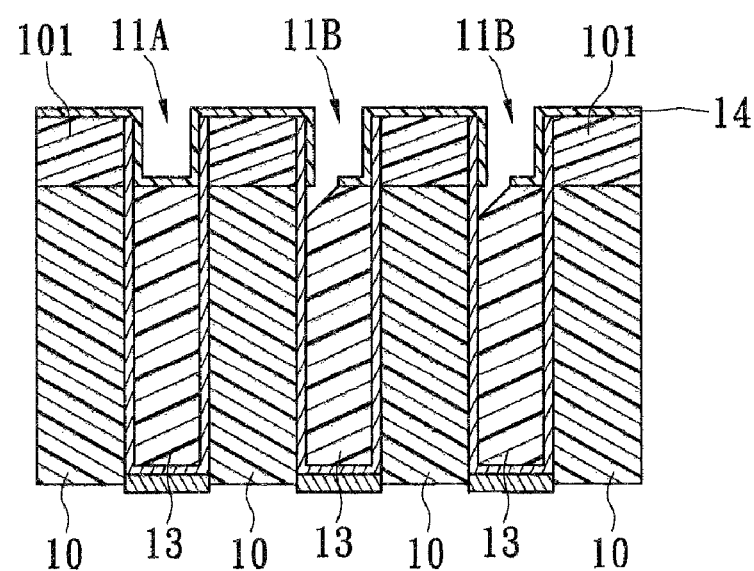
Figure 2H:
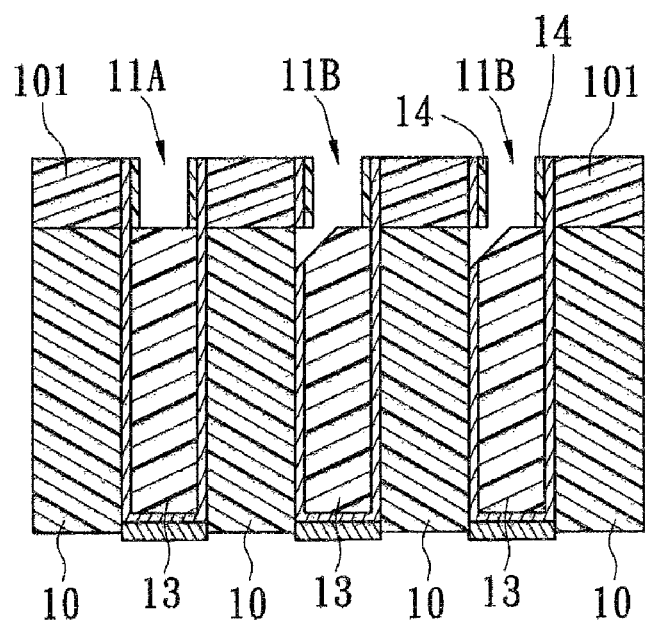
Figure 2I:
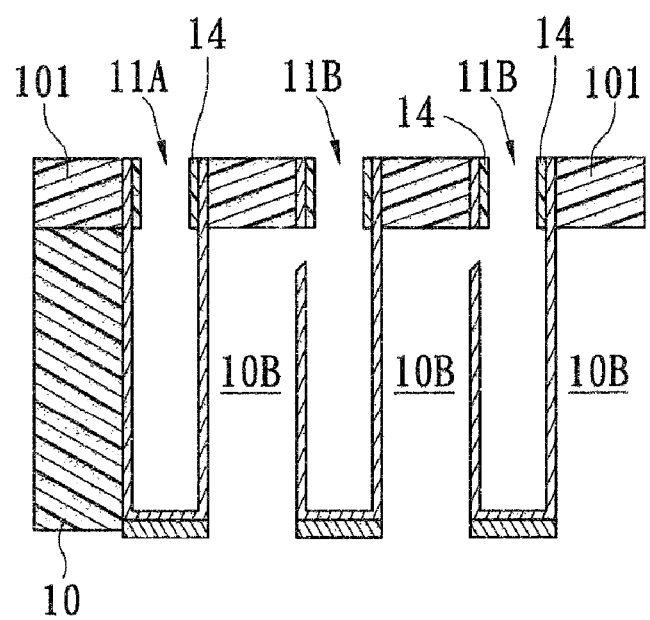

Step (c) is forming a first covering layer 14 and a second covering layer 15 on the sacrificial structure 13. As shown in FIG. 2B, the first covering layer 14 is continuously formed on the structure including the supporting layer 101 and the sacrificial structures 13 of the isolating trench 11A and the capacitor trench 11B. In other words, the first covering layer 14 is formed as a concave-convex structure. On the other hand, the first covering layer 14 is made of silicon nitride (SiN) in the embodiment. Then, the second covering layer 15 of the ploy-silicon is formed on the first covering layer 14 as a concave-convex structure.

Step (d) is modifying the second covering layer 15. Depending on the different process on the isolating trench 11A and the capacitor trench 11B, a part of the second covering layer 15 on the sacrificial structure 12 of the capacitor trenches 11B and the second covering layer 15 on the sacrificial structure 12 of the isolating trench 11A are modified. Therefore, the modified second covering layer 15 and the un-modified second covering layer 15 can have different etching rate and the etching selectivity therebetween is increased. The step (d) includes the following steps:

Step (101) is providing a one-direction ion implanting. Ions are implanted inclinedly to a part of the second covering layer 15 on the sacrificial structure 13 of the capacitor trenches 11B, and are implanted to the second covering layer 13 on the supporting layer 101. Please note the ions are also implanted inclinedly to a part of the second covering layer 15 on the sacrificial structure 13 of the isolating trench 11A. Due to the concave-convex structure, the inclinedly-implanted ions are implanted into a part of the second covering layer 15 in the concave portion. Only a part of the second covering layer 15 on the sacrificial structure 13 are implanted by ions and are modified. Therefore, the modified and the un-modified parts have different etching rate. In the embodiment, phosphorus (P) ions are implanted into the part of the second covering layer 15 and the p-implanted part of the second covering layer 15 has a higher etching rate than the modified second covering layer 15. Thus, the two parts have different etched profile after the etching process.

The entire second covering layer 15 on the sacrificial structure 13 of the isolating trench 11A is necessary to be preserved. Therefore, another ion implanting step is provided to modify the entire second covering layer 15 on the sacrificial structure 13 of the isolating trench 11A. Thus, in next step, the second covering layer 15 on the sacrificial structure 13 of the isolating trench 11A is modified.

Step (102) is blocking the second covering layer 15 on the sacrificial structure 13 of the capacitor trenches 11B. Please refer to FIG. 2D; a photoresist 20 is formed on and blocks the second covering layer 15 on the sacrificial structure 13 of the capacitor trenches 11B from another ion implanting step.

Step (103) is providing a second ion implanting step. Please refer to FIG. 2E; full-direction ions are implanted to the second covering layer 15 on the sacrificial structure 13 of the isolating trench 11A so that the second covering layer 15 on the sacrificial structure 13 of the isolating trench 11A is fully modified. The full-direction ion implantation is used so as to implant ions uniformly to the second covering layer 15 on the sacrificial structure 13 of the isolating trench 11A. Next step is striping the photoresist 20.

Step (e) is removing the un-modified second covering layer 15 on the sacrificial structure 13 of the capacitor trenches 11B, and then removing the first covering layer 14 under the un-modified second covering layer 15 on the sacrificial structure 13 of the capacitor trenches 11B to expose the sacrificial structure 13 of the capacitor trenches 11B. Please refer to FIG. 2F, because of the higher etching rate of the un-modified second covering layer 15, the un-modified second covering layer 15 and the first covering layer 14 under the un-modified second covering layer 15 are etched so that the sacrificial structure 13 of the capacitor trenches 11B is partially exposed. Please note that the second covering layer 15 on the sacrificial structure 13 of the isolating trench 11A does not be removed in this etching step because the entire second covering layer 15 on the sacrificial structure 13 of the isolating trench 11A is modified by the second ion implantation.

Step (f) is removing a part of the sacrificial structure 13 of the capacitor trenches 11B to expose the electrode layer 12 on the sidewall of the capacitor trenches 11B. Please refer to FIG. 2G; the exposed part of the sacrificial structure 13 of the capacitor trenches 11B can be etched so as to expose the electrode layer 12 on the sidewall of the capacitor trenches 11B. Furthermore, the retained second covering layer 15 (i.e., the modified second covering layer 15) is also etched in this step. Therefore, the first covering layer 14 is exposed.

Step (g) is removing the exposed electrode layer 12 on the sidewall of the capacitor trenches 11B. Please refer to FIG. 2H; the exposed electrode layer 12 on the single-sidewall of the capacitor trenches 11B is etched so as to expose the oxide layer 10. Moreover, Step (g) further includes a step of removing the first covering layer 14. In the embodiment, dry etching method (for example, plasma etching method) is used for removing the first covering layer 14. However, the horizontal first covering layer 14 is etched by plasma, but the vertical first covering layer 14 (i.e., the first covering layer 14 on the electrode layer 12) is remained, because of the anisotropy of the dry etching process. After Step (g), the electrode layer 12 and the sacrificial structure 13 of the isolating trench 11A is not etched, and the electrode layer 12 and the sacrificial structure 13 of the capacitor trenches 11B is etched to expose the oxide layer 10.

Step (h) is removing the sacrificial structure 13 in the isolating trench 11A and the capacitor trenches 11B, and removing the oxide layer 10 between the capacitor trenches 11B. Please FIG. 2I; the sacrificial structure 13 in the capacitor trenches 11B is removed by a etching method and the etching solution etches the oxide layer 10 through the opening of the electrode layer 12 so as to define a space 10B. Therefore, the electrode layer 12 of the capacitor trenches 11B are constructed as double-side capacitor. On the other hand, the sacrificial structure 13 in the isolating trench 11A is etched but the intact electrode layer 12 of the isolating trench 11A prevents the oxide layer 10 out of the isolating trench 11A from etching.

After the steps of the present invention, a plurality of double-side capacitors is formed. The double-side capacitors have symmetric structure and improved electric capacity. On the other hand, the standing electrode layer 12 is supported by the supporting layer 101 so that the double-side capacitors of the present invention have improved structure strength.

In summary, the present invention has the following advantages.

1. The manufacturing method of the present invention has simplified steps so that the manufacturing cost is reduced. It is no necessary to use high precise photo mask and the manufacturing yield of the present method is improved.

2. The double-side capacitors of the present invention have improved structure strength and improved property of electric capacity.

The above-mentioned descriptions represent merely the preferred embodiments of the present invention, without any intention to limit the scope of the present invention thereto. Various equivalent changes, alternations or modifications based on the claims of present invention are all consequently viewed as being embraced by the scope of the present invention.

What is claimed is:

1. A manufacturing method for double-side capacitor of stack DRAM comprising steps of:
   forming an isolating trench and a plurality of capacitor trenches in an oxide layer wherein each of the isolating trench and the capacitor trenches has an electrode layer on a sidewall thereof;
   forming a sacrificial structure in the isolating trench and the capacitor trenches, respectively;
   forming a first covering layer and a second covering layer on the sacrificial structure;
   modifying a part of the second covering layer on the sacrificial structure of the capacitor trenches, and modifying the second covering layer on the sacrificial structure of the isolating trench;
   removing the un-modified second covering layer on the sacrificial structure of the capacitor trenches, then removing the first covering layer under the un-modified second covering layer on the sacrificial structure of the capacitor trenches to expose the sacrificial structure of the capacitor trenches;
   removing a part of the sacrificial structure of the capacitor trenches to expose the electrode layer on the sidewall of the capacitor trenches;
   removing the exposed electrode layer on the sidewall of the capacitor trenches to expose the oxide layer; and
   removing the sacrificial structure in the isolating trench and the capacitor trenches, and removing the oxide layer between the capacitor trenches so that the electrode layers of the capacitor trenches are constructed as a plurality of double-side capacitors.

2. The manufacturing method according to claim 1, wherein the oxide layer has a supporting layer thereon, and the isolating trench and the capacitor trenches are formed in the supporting layer and the oxide layer.

3. The manufacturing method according to claim 2, wherein each of the isolating trench and the capacitor trenches has the electrode layer on a bottom thereof in the step of forming an isolating trench and a plurality of capacitor trenches in an oxide layer.

4. The manufacturing method according to claim 2, wherein the step of forming a sacrificial structure in the isolating trench and the capacitor trenches includes an etching back step to etch the sacrificial structure so that a top of the sacrificial structure is lowered to a bottom of the supporting layer.

5. The manufacturing method according to claim 4, wherein the first covering layer and the second covering layer are formed on the sacrificial structure and the supporting layer in the step of forming a first covering layer and a second covering layer on the sacrificial structure.

6. The manufacturing method according to claim 5, wherein the step of modifying a part of the second covering layer on the sacrificial structure of the capacitor trenches includes steps of:
   providing a one-direction ion implanting step, wherein ions are implanted inclinedly to the part of the second covering layer on the sacrificial structure of the capacitor trenches, and are implanted to the second covering layer on the supporting layer;
   blocking the second covering layer on the sacrificial structure of the capacitor trenches; and
   providing a full-direction ion implanting step, wherein ions are implanted to the second covering layer on the sacrificial structure of the isolating trench so that the second covering layer on the sacrificial structure of the isolating trench is modified.

7. The manufacturing method according to claim 6, wherein the step of blocking the second covering layer on the sacrificial structure of the capacitor trenches provides a photoresist on the second covering layer on the sacrificial structure of the capacitor trenches.

8. The manufacturing method according to claim 6, wherein the un-modified second covering layer on the sacrificial structure of the capacitor trenches has a higher etching rate than the modified second covering layer, and the un-modified second covering layer on the sacrificial structure of the capacitor trenches is removed by a etching method is the step of removing the un-modified second covering layer on the sacrificial structure of the capacitor trenches.

9. The manufacturing method according to claim 8, wherein the part of the sacrificial structure of the capacitor trenches and the modified second covering layer on the sacrificial structure of the capacitor trenches are etched in the step of removing a part of the sacrificial structure of the capacitor trenches to expose the electrode layer.

10. The manufacturing method according to claim 9, wherein the step of removing the exposed electrode layer includes a step of removing the first covering layer.

11. The manufacturing method according to claim 10, wherein the first covering layer is removed by a dry etching method.

12. The manufacturing method according to claim 1, wherein the first covering layer is a silicon nitride layer, the second covering layer is a ploy-silicon layer, the electrode layer is a metal layer of titanium nitride, and a metal layer of titanium is further formed under the electrode layer on the bottom of isolating trench and the capacitor trenches.

13. A manufacturing method for double-side capacitor of stack DRAM comprising steps of:
   forming an isolating trench and a plurality of capacitor trenches in an oxide layer wherein each of the isolating trench and the capacitor trenches has an electrode layer on a sidewall thereof;
   forming a sacrificial structure in the isolating trench and the capacitor trenches, respectively;
   forming a first covering layer and a second covering layer on the sacrificial structure;
   providing an one-direction ion implanting step, wherein ions are implanted inclinedly to the part of the second covering layer on the sacrificial structure of the capacitor trenches, and are implanted to the second covering layer on the supporting layer;
   blocking the second covering layer on the sacrificial structure of the capacitor trenches;
   providing a full-direction ion implanting step, wherein ions are implanted to the second covering layer on the sacrificial structure of the isolating trench so that the second covering layer on the sacrificial structure of the isolating trench is modified;

removing the un-modified second covering layer on the sacrificial structure of the capacitor trenches, then removing the first covering layer under the un-modified second covering layer on the sacrificial structure of the capacitor trenches to expose the sacrificial structure of the capacitor trenches;

removing a part of the sacrificial structure of the capacitor trenches to expose the electrode layer on the sidewall of the capacitor trenches;

removing the exposed electrode layer on the sidewall of the capacitor trenches to expose the oxide layer; and removing the sacrificial structure in the isolating trench and the capacitor trenches, and removing the oxide layer between the capacitor trenches so that the electrode layers of the capacitor trenches are constructed as a plurality of double-side capacitors.

14. The manufacturing method according to claim 13, wherein the oxide layer has a supporting layer thereon, and the isolating trench and the capacitor trenches are formed in the supporting layer and the oxide layer.

15. The manufacturing method according to claim 14, wherein each of the isolating trench and the capacitor trenches has the electrode layer on a bottom thereof in the step of forming an isolating trench and a plurality of capacitor trenches in an oxide layer; and the step of forming a sacrificial structure in the isolating trench and the capacitor trenches includes an etching back step to etch the sacrificial structure so that a top of the sacrificial structure is lowered to a bottom of the supporting layer.

16. The manufacturing method according to claim 15, wherein the first covering layer and the second covering layer are formed on the sacrificial structure and the supporting layer in the step of forming a first covering layer and a second covering layer on the sacrificial structure.

17. The manufacturing method according to claim 16, wherein the step of blocking the second covering layer on the sacrificial structure of the capacitor trenches provides a photoresist on the second covering layer on the sacrificial structure of the capacitor trenches; and wherein the un-modified second covering layer on the sacrificial structure of the capacitor trenches has a higher etching rate than the modified second covering layer, and the un-modified second covering layer on the sacrificial structure of the capacitor trenches is removed by a etching method is the step of removing the un-modified second covering layer on the sacrificial structure of the capacitor trenches.

18. The manufacturing method according to claim 17, wherein the part of the sacrificial structure of the capacitor trenches and the modified second covering layer on the sacrificial structure of the capacitor trenches are etched in the step of removing a part of the sacrificial structure of the capacitor trenches to expose the electrode layer.

19. The manufacturing method according to claim 18, wherein the step of removing the exposed electrode layer includes a step of removing the first covering layer by a dry etching method.

20. The manufacturing method according to claim 13, wherein the first covering layer is a silicon nitride layer, the second covering layer is a ploy-silicon layer, the electrode layer is a metal layer of titanium nitride, and a metal layer of titanium is further formed under the electrode layer on the bottom of isolating trench and the capacitor trenches.

* * * * *